(12) United States Patent
Takahashi

(10) Patent No.: US 6,989,863 B1
(45) Date of Patent: Jan. 24, 2006

(54) PHOTOELECTRIC CONVERTING APPARATUS HAVING AMPLIFIERS WITH DIFFERENT GAINS FOR ITS SENSOR AD STORAGE UNITS

(75) Inventor: Hidekazu Takahashi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/384,973

(22) Filed: Aug. 30, 1999

(30) Foreign Application Priority Data

Aug. 31, 1998 (JP) .................................. 10-245216

(51) Int. Cl.
 H04N 3/14 (2006.01)
 H04N 5/335 (2006.01)
 H04N 9/64 (2006.01)
 H04N 5/217 (2006.01)
 H04N 5/228 (2006.01)

(52) U.S. Cl. .................... 348/308; 348/217.1; 348/243; 348/301; 348/607; 348/241; 348/311; 348/208.1

(58) Field of Classification Search ................ 348/308, 348/217.1, 243, 301, 607, 241, 311, 208.1
See application file for complete search history.

(56) References Cited

U.S. PATENT DOCUMENTS

| | | | | |
|---|---|---|---|---|
| 5,142,286 A | * | 8/1992 | Ribner et al. ................. | 341/143 |
| 5,280,511 A | * | 1/1994 | Fujii et al. ...................... | 377/60 |
| 5,311,320 A | * | 5/1994 | Hashimoto ................... | 348/243 |
| 5,335,008 A | * | 8/1994 | Hamasaki .................... | 348/301 |
| 5,367,340 A | * | 11/1994 | Spencer ....................... | 348/607 |
| 5,698,844 A | * | 12/1997 | Shinohara et al. ....... | 250/214 R |
| 5,717,458 A | * | 2/1998 | Yonemoto .................... | 348/305 |
| 5,737,016 A | * | 4/1998 | Ohzu et al. ................. | 348/241 |
| 5,786,588 A | | 7/1998 | Takahashi ................ | 250/208.1 |
| 5,929,434 A | * | 7/1999 | Kozlowski et al. ...... | 250/214 A |
| 5,955,753 A | | 9/1999 | Takahashi .................... | 257/292 |
| 6,061,093 A | * | 5/2000 | Yonemoto .................... | 348/305 |
| 6,147,338 A | * | 11/2000 | Takahashi ................ | 250/208.1 |
| 6,163,215 A | * | 12/2000 | Shibata et al. .............. | 330/254 |
| 6,410,899 B1 | * | 6/2002 | Merrill et al. ........... | 250/208.1 |
| 6,512,544 B1 | * | 1/2003 | Merrill et al. .............. | 348/302 |

FOREIGN PATENT DOCUMENTS

JP 9-200629 7/1997

* cited by examiner

Primary Examiner—Thai Tran
Assistant Examiner—James M. Hannett
(74) Attorney, Agent, or Firm—Fitzpatrick, Cella, Harper & Scinto

(57) ABSTRACT

In a photoelectric converting apparatus including a sensor unit, a transfer unit, and a memory unit, noise can be minimized. The sensor unit includes a plurality of pixels each having at least a photoelectric converter and a first amplifier for amplifying a signal derived from the photoelectric converter, and a memory unit including a plurality of storage elements, for storing the signal derived from the sensor unit, each storage element having a second amplifier for amplifying a signal derived from the storage element to output an amplified signal, wherein the gain of the first amplifier is made different from a gain of the second amplifier.

12 Claims, 4 Drawing Sheets

PHOTOELECTRIC CONVERTING APPARATUS HAVING AMPLIFIERS WITH DIFFERENT GAINS FOR ITS SENSOR AD STORAGE UNITS

BACKGROUND OF THE INVENTION

1. Field of the Invention

The present invention relates to a photoelectric converting apparatus including a sensor unit and a memory unit.

2. Related Background Art

As one of conventional amplification type photoelectric converting apparatuses having sensor units, transfer units, and memory units, a CMOS inverting amplifier type sensor has been proposed in Japanese Patent Application Laid-open No. 09-200629, for example. The circuit arrangement of this conventional sensor apparatus is shown in FIG. 1. In this drawing, reference numeral 1 denotes a PN photodiode for performing a photoelectric converting (transfer) operation; 2, an amplifying MOS transistor for constituting an inverting amplifier; 3, a switch MOS transistor for supplying an output derived from a pixel to a vertical signal line 28; and 4, a resetting MOS transistor for resetting a potential of the photodiode. These circuit elements 1 to 4 constitute one pixel 5. Also, reference numeral 6 denotes a load MOS transistor of the inverting amplifier, and this load MOS transistor 6 is provided every vertical line. Reference numeral 7 denotes a transfer gate used to transfer pulses $\phi_{SL1}$ and $\phi_{PS1}$ which are employed to drive the respective pixels. The transfer gate 7 is controlled by a vertical scanning circuit 8. These circuit elements 1 to 8 constitute a sensor unit. Also, reference numeral 9 denotes a switch MOS transistor for entering an output signal derived from a pixel of the sensor unit into a transfer unit; 10, a clamp capacitance; and 11, another switch MOS transistor for entering thereinto a clamp potential $V_{GR}$. Reference numeral 12 denotes an amplifying MOS transistor of a source follower; 13, a constant current source of the source follower; 14, a switch MOS transistor for feeding back an output derived from a clamp circuit to a pixel of the sensor unit; 15, a switch MOS transistor for entering an output derived from a memory circuit to the clamp circuit; and 16, another switch MOS transistor for supplying an output signal derived from the clamp circuit to a memory pixel 21. These circuit elements 10 to 13 constitute the clamp circuit used to eliminate noise. Furthermore, the circuit elements 9 to 16 constitute the transfer unit. Also, reference numeral 17 denotes a memory capacitance; 18, an amplifying MOS transistor of the inverting amplifier; 19, a switch MOS transistor used to read an output signal derived from the memory pixel to the vertical signal line; and 20, another switch MOS transistor used to enter an output derived from a pixel of the sensor unit, or from the transfer unit into the memory capacitance. These circuit elements 17 to 20 constitute a memory. Reference numeral 23 denotes a transfer gate for transferring memory drive pulses $\phi_{PS2}$ and $\phi_{SL2}$, and this transfer gate 23 is driven by a vertical scanning circuit 24. Also, reference numeral 22 denotes a load MOS transistor of the inverting amplifier, and a single load MOS transistor 22 is provided every column. These circuit elements 17 to 24 constitute the memory unit.

Reference numeral 25 denotes a horizontal selection MOS switch. The horizontal selection MOS switch 25 is controlled by a horizontal scanning circuit 26 in such a manner that the output signals derived from the respective memory cells are outputted via an output amplifier 27 to an external circuit in a serial form.

In this conventional CMOS inverting amplifier type sensor, as to the pixel cell of the sensor unit and the memory of the memory unit, since the circuits for constituting the inverting amplifiers are completely identical to each other, these inverting amplifier circuits are designed by employing the same parameters (for example, L, W, $C_{OX}$ of MOS transistor). However, the gain of the inverting amplifier for the pixels of the sensor unit is equal to that of the inverting amplifier for the memory of the memory unit under such a condition that the circuits of the above-mentioned conventional sensor are not operated. As a result, this conventional sensor owns the below-mentioned drawbacks.

That is, in the case that the conventional sensor circuit is actually operated, since the gain of the signal outputted from the pixel of the sensor unit is different from that of the signal outputted from the memory of the memory unit, noise cannot be correctly removed.

It should be noted that a gain obtained under such a condition that the circuit is not operated will be referred to as a "DC gain", whereas another gain obtained under such a state that the circuit is actually operated will be referred to as an "AC gain" in the below-mentioned description.

Also, for example, when the conventional photoelectric converting apparatus is employed as an auto-focus (AF) sensor of a single-lens reflex camera, there are other drawbacks that precision of an AGC (automatic gain control) circuit and also precision achieved under low brightness photographic condition would be deteriorated.

SUMMARY OF THE INVENTION

An object of the present invention is to provide a photoelectric converting apparatus capable of correctly removing noise.

To achieve the above-described object, according to one aspect of the present invention, there is provided a photoelectric converting apparatus comprising: a sensor unit including a plurality of pixels each having at least photoelectric converting means and first amplifying means for amplifying a signal derived from the photoelectric converting means to output the amplified signal; and a memory unit including a plurality of memories each having at least storing means for storing thereinto the signal derived from the sensor unit and second amplifying means for amplifying a signal derived from the storing means to output an amplified signal; wherein a gain of the first amplifying means is made different from a gain of the second amplifying means.

Other objects and features of the present invention will become apparent from the following specification and the accompanying drawings.

DESCRIPTION OF THE PREFERRED EMBODIMENTS

Figure 1:
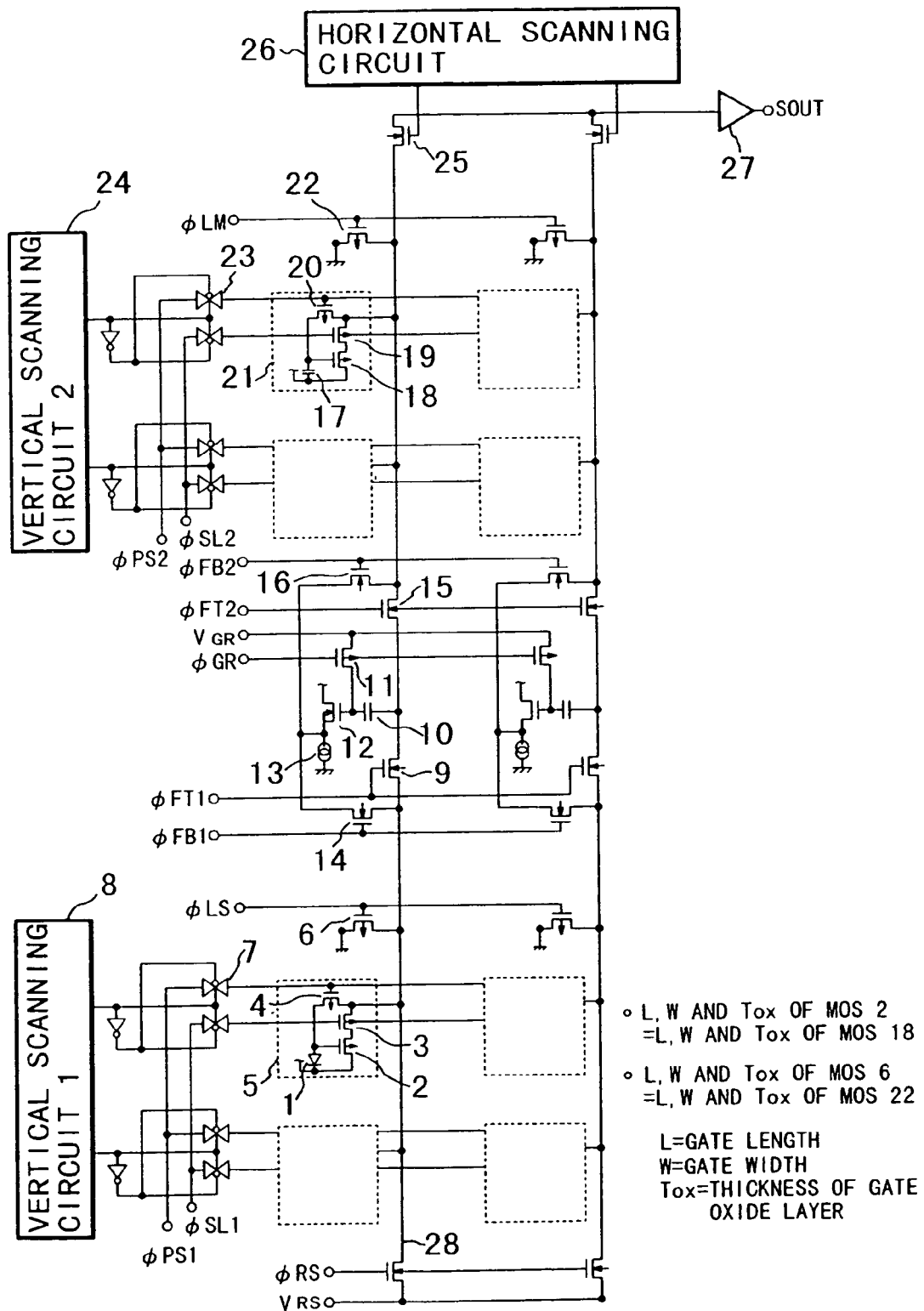
FIG. 1 schematically shows a circuit diagram of the conventional photoelectric converting apparatus.
Figure 2:
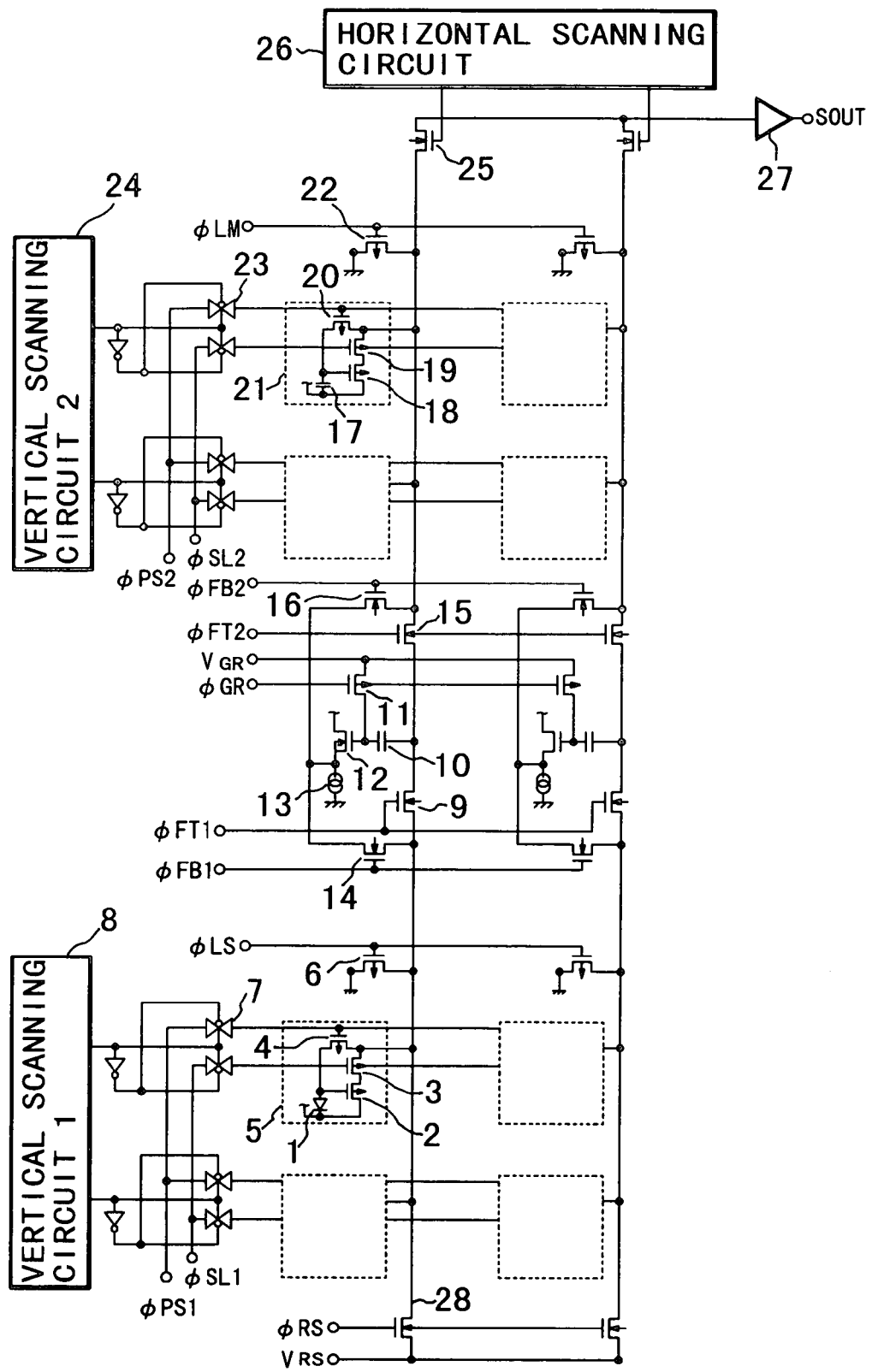
FIG. 2 schematically represents a circuit diagram of a photoelectric converting apparatus according to a first embodiment through a third embodiment of the present invention.

FIG. 2 is a drawing for representing a photoelectric converting apparatus according to a first embodiment, which may best show a feature of the present invention. The photoelectric converting apparatus includes, as shown in FIG. 2, a sensor unit for converting light into an electric signal to output the electric signal, a memory unit for storing thereinto the electric signal derived from the sensor unit, and a transfer unit for transferring a signal outputted from the sensor unit to the memory unit. In this drawing, reference numeral 1 denotes a PN photodiode for performing a photoelectric converting (transfer) operation; 2, an amplifying MOS transistor for constituting an inverting amplifier; 3, a switch MOS transistor for supplying an output derived from a pixel to a vertical signal line 28; and 4, a resetting MOS transistor for resetting a potential of the photodiode. These circuit elements 1 to 4 constitute one pixel 5. Also, reference numeral 6 denotes a load MOS transistor of the inverting amplifier, and this load MOS transistor 6 is provided every vertical line. Reference numeral 7 denotes a transfer gate used to transfer pulses $\phi_{SL1}$ and $\phi_{PS1}$ which are employed to drive the respective pixels. The transfer gate 7 is controlled by a vertical scanning circuit 8. These circuit elements 1 to 8 constitute the sensor unit. Also, reference numeral 9 denotes a switch MOS transistor for entering an output signal derived from a pixel of the sensor unit into the transfer unit; 10, a clamp capacitance; and 11, another switch MOS transistor for entering thereinto a clamp potential $V_{GR}$. Reference numeral 12 denotes an amplifying MOS transistor of a source follower; 13, a constant current source of the source follower; 14, a switch MOS transistor for feeding back an output derived from a clamp circuit to a sensor cell; 15 shows a switch MOS transistor for entering an output derived from a memory circuit to the clamp circuit; and 16, another switch MOS transistor for supplying an output signal derived from the clamp circuit to a memory 21. These circuit elements 10 to 13 constitute the clamp circuit used to eliminate noise. Furthermore, the circuit elements 9 to 16 constitute the transfer unit. Also, reference numeral 17 denotes a memory capacitance; 18, an amplifying MOS transistor of the inverting amplifier; 19, a switch MOS transistor used to read signal derived from the memory capacitance 17 to the vertical signal line; and 20, another switch MOS transistor used to enter an output derived from a pixel of the sensor unit, or from the clamp unit into the memory capacitance. These circuit elements 17 to 20 constitute the memory 21. Reference numeral 23 denotes a transfer gate for transferring memory drive pulses $\phi_{PS2}$ and $\phi_{SL2}$, and this transfer gate 23 is driven by a vertical scanning circuit 24. Also, reference numeral 22 denotes a load MOS transistor of the inverting amplifier, and a single load MOS transistor 22 is provided every column. These circuit elements 17 to 24 constitute the memory unit. Reference numeral 25 denotes a horizontal selection MOS switch. The horizontal selection MOS switch 25 is controlled by a horizontal scanning circuit 26 in such a manner that the output signals derived from the respective memory cells are outputted via an output amplifier 27 to an external circuit in a serial form.

The photoelectric converting apparatus of the present embodiment is characterized in that a DC gain of an inverting amplifier of a pixel is made different from an AC gain of an inverting amplifier of a memory.

Hereinafter, a description will now be more specifically made of a method for differing the gain of the inverting amplifier according to this embodiment. That is, in the circuit shown in FIG. 2, assuming that a stray capacitance between the vertical output line and the photodiode is $C_{SS}$, a capacitance of this photodiode is $C_{PDS}$, another stray capacitance between the vertical output line and the memory capacitance is $C_{SM}$, a capacitance of the memory capacitance is $C_{PDM}$, the AC gain of the inverting amplifier of the pixel employed in the sensor unit is $G_{ACS}$, the AC gain of the inverting amplifier of the memory employed in the memory unit is $G_{ACM}$, the DC gain of the inverting amplifier of the pixel employed in the sensor unit is $G_{DCS}$, and also the DC gain of the inverting amplifier of the memory employed in the memory unit is $G_{DSM}$.

The AC gain $G_{ACS}$ of the pixel, and the AC gain $G_{ACM}$ of the memory are given as follows:

$$G_{ACS}=(C_{PDS}+C_{SS})/\{C_{PDS}+(1+G_{DCS})C_{SS}\}\cdot G_{DCS} \quad (1)$$

$$G_{ACM}=(C_{PDM}+C_{SM})/\{C_{PDM}+(1+G_{DCM})C_{SM}\}\cdot G_{DCM} \quad (2)$$

As a consequence, in order to make the AC gain $G_{ACS}$ of the inverting amplifier coincident with the AC gain $G_{ACM}$, both the DC gain $G_{DCS}$ of the inverting amplifier and the DC gain $G_{DCM}$ may be determined which may satisfy the below-mentioned formula (3):

$$(C_{PDS}+C_{SS})/\{C_{PDS}+(1+G_{DCS})C_{SS}\}\cdot G_{DCS}=$$
$$(C_{PDM}+C_{SM})/\{C_{PDM}+(1+G_{DCM})C_{SM}\}\cdot G_{DCM} \quad (3)$$

The photoelectric converting apparatus of this first embodiment is characterized in that the size (dimension) of the amplifying MOS transistor 2 of the pixel employed in the sensor unit is made equal to the size of the amplifying MOS transistor 18 of the memory employed in the memory unit, whereas the size of the load MOS transistor 6 of the pixel employed in the sensor unit is made different from the size of the load MOS transistor 22 of the memory employed in the memory unit. More specifically, it is preferable to manufacture both the amplifying MOS transistor 2 and the amplifying MOS transistor 18 by the minimum rule of the manufacturing process thereof in view of sensitivity. Also, since the memory capacitance 17 is larger than the capacitance of the photodiode 1, lowering of the gain caused by the adverse influence made by the stray capacitance is small. As a consequence, a size relationship between the MOS transistor 6 and the MOS transistor 22 may be set as follows:

$$W_6/L_6 < W_{22}/L_{22},$$

assuming that a gate width of the MOS transistor 6 is $W_6$, a gate length of this MOS transistor 6 is $L_6$, a gate width of the MOS transistor 22 is $W_{22}$, and a gate length of the MOS transistor 22 is $L_{22}$.

If the gate width $W_6$ is made equal to the gate width $W_{22}$, then the gate lengths may be set as follows:

$$L_6 > L_{22}$$

Alternatively, if the gate length $L_6$ is made equal to the gate length $L_{22}$, then the gate widths may be set as follows:

$$W_6 < W_{22}$$

Figure 4:
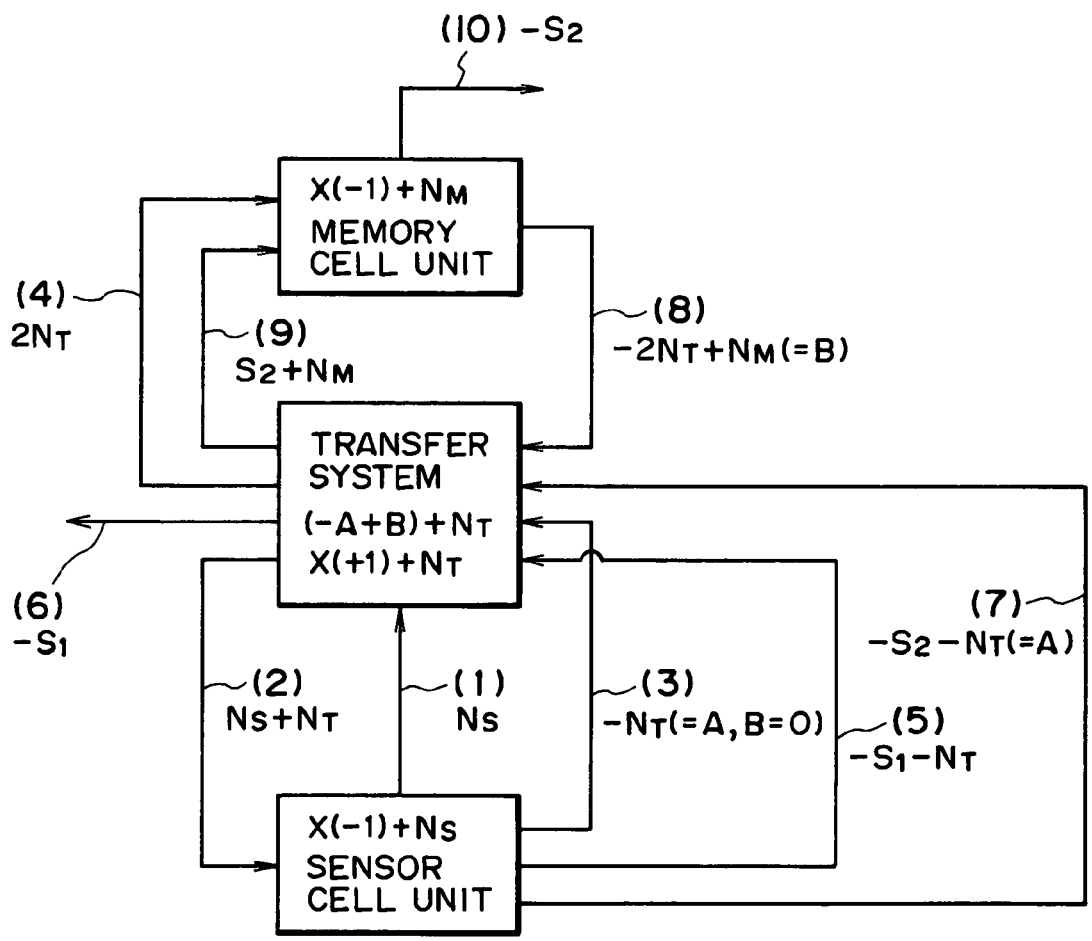
FIG. 4 is an explanatory diagram for illustratively explaining the operations of the photoelectric converting apparatus shown in FIG. 2.

Next, a signal flow of the photoelectric converting operation by the photoelectric converting apparatus according to the first embodiment will now be summarized with reference to a schematic diagram of FIG. 4.

(1) First, noise $N_S$ of the sensor unit is read out from the sensor unit, and then, is transferred to a transfer system.

(2) In the transfer system, noise $N_T$ of the transfer system is added, and noise $(N_S+N_T)$ is inputted to the sensor unit.

(3) The noise $N_S$ of the sensor unit is added to an inverted output $-(N_S+N_T)$, and finally noise $-N_T$ is outputted from the sensor unit. This noise $-N_T$ is sent to the transfer system.

(4) In the transfer system, this noise $-N_T$ is inverted into an inverted signal $N_T$, and then noise $N_T$ of the transfer system is added to this inverted signal $N_T$ to obtain noise $2N_T$ which is sent to the memory unit.

(5) The sensor unit is entered to a light signal accumulation operation period (noise $N_S+N_T$ is left in sensor unit). During this light signal accumulation operation period, a signal corresponding to the signal charge accumulated in the sensor unit is read out. This output signal corresponds to $(-S_1-N_T)$, and is transferred to the transfer system.

(6) In the transfer system, noise $N_T$ of the transfer system is added to the signal $(-S_1-N_T)$ to obtain a signal $-S_1$. This signal is outputted as a signal during the light signal accumulation operation period.

(7) In the sensor unit, the light signal accumulation operation is furthermore carried out, and a signal corresponding to a signal charge accumulated after the accumulation operation period is accomplished is read out, and then this read signal is stored into the transfer system. This output signal is $(-S_2-N_T)$.

(8) Noise $N_M$ of the memory unit is added to the inverted signal $-2_T$ derived from the memory unit to produce noise $(-2N_T+n_M)$. Then, this noise is read into the transfer system.

(9) In the transfer system, a subtraction process is carried out by subtracting the signal $(-S_2-N_T)$ from the noise $(-2N_T+N_M)$, and the noise $N_T$ of the transfer system is added to the subtraction result to obtain a signal $(S_2+N_M)$ which is transferred to the memory unit.

(10) The noise $N_M$ of the memory unit is added to the inverted signal $(-S_2-N_M)$ derived from the memory unit to thereby output an addition result $(-S_2)$.

Figure 3:
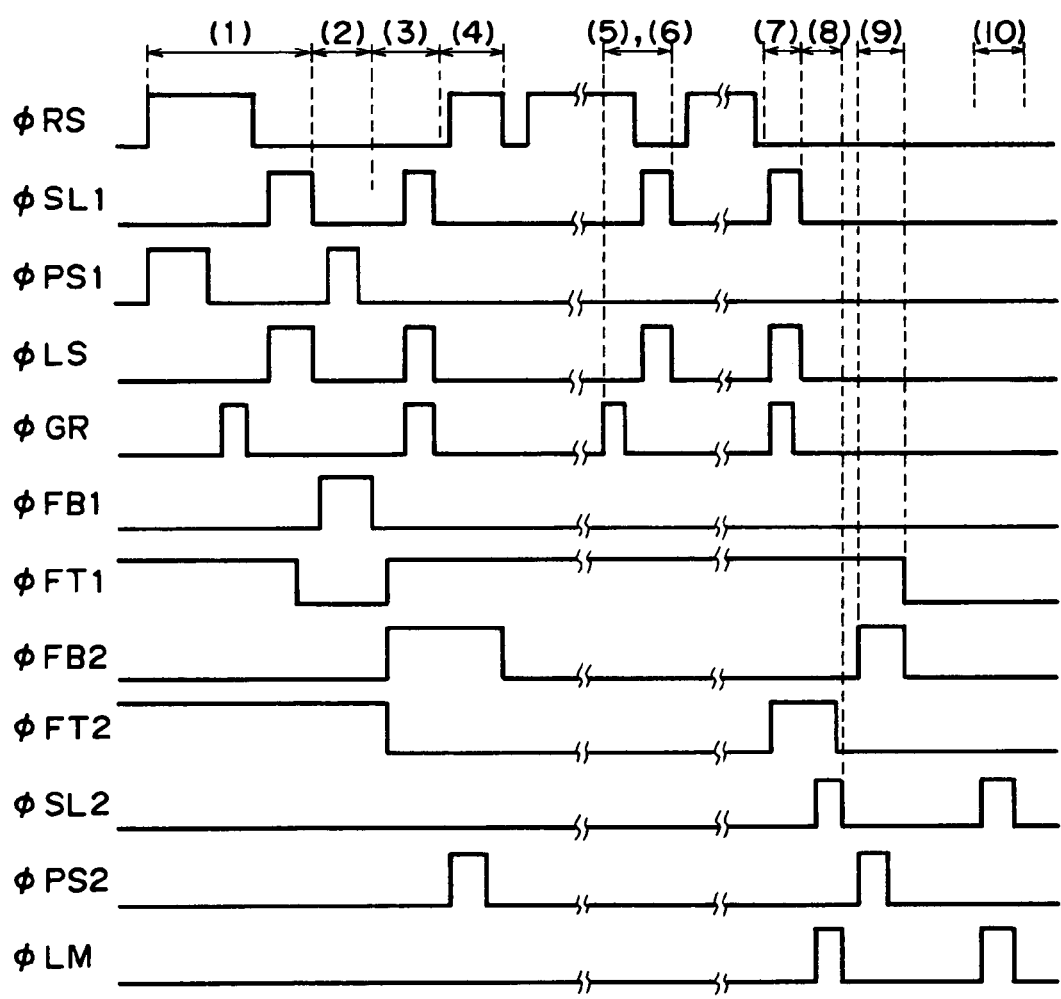
FIG. 3 indicates an operation timing chart for explaining operations of the photoelectric converting apparatus shown in FIG. 2.

Referring now to FIG. 2 and FIG. 3, the above-described operations (1) to (10) of the photoelectric converting apparatus will be described more in detail.

First of all, while both a signal $\phi_{RS}$ and another signal $\phi_{PS1}$ are set as "H" levels, the sensor unit is reset.

Next, after the signal $\phi_{PS1}$ is set to an "L" level, the signal $\phi_{GR}$ is set to an "H" level. At this time, signals $\phi_{FT1}$ and $\phi_{FT2}$ are maintained under "H" level states. As a result, an electrode provided on the side of the common output line of the capacitance 10 in the transfer system is set to the potential of $V_{RS}$, and another electrode of the capacitance 10 is set to the potential of $V_{GR}$.

Furthermore, after the signal $\phi_{GR}$ is set to an "L" level and the signal $\phi_{RS}$ is set to an "L" level, while both the signal $\phi_{SL1}$ and the signal $\phi_{L1}$ are set to "H" levels, the sensor noise output from the sensor unit after being reset is read to the common output line (at this time, sensor noise is read out as $N_S$). The foregoing operations correspond to the operations defined in the above item (1).

Since the potential at the common output line is varied by the sensor noise component $N_S$, the potential at the other electrode of the capacitance 10 set under stray condition is also varied by the sensor noise component $N_S$. In such a case that the signal $\phi_{FT1}$ is set to an "L" level, both the signal $\phi_{SL1}$ and the signal $\phi_{L1}$ are set to "L" levels, the signal $\phi_{FB1}$ is set to an "H" level, and furthermore, the signal $\phi_{PS1}$ is set to an "H" level, the sensor noise $N_S$ is transferred from the transfer system to the sensor unit. At this time, since the noise $N_T$ of the transfer system is additionally provided with this sensor noise $N_S$, finally the noise of $(N_S+N_T)$ is inputted to the sensor unit (namely, sensor cell transfer operation of noise). The foregoing operations correspond to the operations defined in the above-explained item (2).

Next, while both the signal $\phi_{FT1}$ and the signal $\phi_{FB2}$ are set to "H" levels, and furthermore the signal $\phi_{GR}$, the signal $\phi_{SL1}$ and the signal $\phi_{LS}$ are set to "H" levels, the noise $N_S$ of the sensor unit is added to the inverted output signal $-(N_S+N_T)$ to eventually output noise $-N_T$ from the sensor unit. This noise $-N_T$ is sent to the transfer system. At this time, a potential at the electrode provided on the side of the common output line of the capacitance 10 employed in the transfer system is varied by the noise component $-N_T$. On the other hand, a potential at the other electrode of this capacitance 10 is fixed to $V_{GR}$. In addition, while the signal $\phi_{GR}$ is set to an "L" level, the other electrode of the capacitance 10 is brought into a stray condition (namely, noise reading operation). These foregoing operations correspond to the operations defined in the above-described item (3).

Next, while both the signal $\phi_{RS}$ and the signal $\phi_{PS2}$ are set to "H" levels, a potential at the electrode provided on the side of the common output line of the capacitance 10 employed in the transfer system becomes $V_{RS}$, and is varied by the noise component $N_T$. As a result, a potential at the other electrode of the capacitance 10 is similarly varied by the noise component $N_T$, and the noise $N_T$ is transferred from the transfer system to the memory unit. At this time, since the transfer system noise $N_T$ of the transfer system is added to this transferred noise $N_T$, noise $2N_T$ is eventually entered into the memory unit (namely, memory transfer operation of noise). The foregoing operations corresponds to the operations defined in the above-explained item (4).

Subsequently, the sensor unit is entered into the light signal accumulation operation period, and then, this sensor unit reads signals corresponding to signal charges accumulated in the sensor unit during this light signal accumulation operation period in the below-mentioned manner.

That is, while the signal $\phi_{GR}$ is set to an "H" level (at this time, signal $\phi_{RS}$ is maintained at "H" level), a potential at the electrode provided on the side of the common output line of the capacitance 10 of the transfer system is set to $V_{RS}$ and a potential at the other electrode of the capacitor 10 is set to $V_{GR}$. Furthermore, the signal $\phi_{GR}$ is set to an "L" level, a potential at the other electrode of the capacitor 10 is set to a stray condition. Thereafter, when the signal $\phi_{SL1}$ and the signal $\phi_{LS}$ are set to "H" levels, the noise $N_S$ of the sensor unit is added to the inverted output $-(S_1+N_S+N_T)$, so that a signal $(-S_1-N_T)$ is eventually outputted from the sensor unit to be supplied to the transfer system. These foregoing operations correspond to the operations defined in the above-described item (5).

Since a potential at the electrode provided on the side of the common output line of the capacitance 10 employed in the transfer system is varied by the signal component $(-S_1-N_T)$, a potential at the other electrode of the capacitance 10 is also varied by the same potential component to become $V_{GR}+(-S_1-N_T)$. In such a case that a signal is transferred from the transfer system, since the noise $N_T$ of the transfer system is added to this signal, a signal $-S_1$ is eventually outputted from the transfer system. The foregoing operations correspond to the operations defined in the above-described item (6).

Next, the light signal accumulation operation is further carried out in the sensor unit. After this light signal accumulation operation period is completed, when the signals $\phi_{SL1}$, $\phi_{LS}$, $\phi_{CR}$, and $\phi_{FT2}$ are set to "H" levels, a potential at the other electrode of the capacitance 10 of the transfer system is fixed to $V_{GR}$, and the potential at the electrode provided on the side of the common output line of the capacitance 10 is varied from $V_{RS}$ by the signal component ($-S_2-N_T$). It should be noted that the signal ($-S_2-N_T$) is equal to such a signal produced by adding the noise $N_S$ of the sensor unit to the inverted output $-(S_2+N_S+N_T)$ derived from the sensor unit. The foregoing operations correspond to the operations defined in the above-described item (7).

Next, when the signals $\phi_{SL2}$ and $\phi_{LM}$ are set to "H" levels, while the noise $N_M$ of the memory unit is added to the inverted signal $-2N_T$ derived from the memory unit, a signal ($-2N_T+N_M$) is read out to the electrode provided on the side of the common output line of the capacitance 10 employed in the transfer system (at this time, the other electrode of capacitance 10 of the transfer system is brought into stray condition). The foregoing operations correspond to the operations defined in the above-described item (8).

As a result, since the potential variation of the electrode provided on the side of the common output line of the capacitance 10 becomes $-(-S_2-N_T)+(-2N_T+N_M) = S_2-N_T+N_M$, the potential variation of the other electrode of the capacitor 10 similarly becomes ($S_2-N_T+N_M$). When the signals $\phi_{FB2}$ and $\phi_{PS2}$ are set to "H" levels, a signal ($S_2-N_T+N_M$) is transferred from the transfer system to the memory unit. At this time, since the noise $N_T$ of the transfer system is also produced, a signal ($S_2+N_M$) is eventually entered into the memory unit. These operations correspond to the operations defined in the above-described item (9).

Subsequently, while both signal $\phi_{SL2}$ and signal $\phi_{LM}$ are set to "H" levels, a signal is read out from the memory unit to be outputted. In this case, since the noise $N_M$ of the memory unit is added to the inverted signal ($-S_2-N_M$), a sensor signal $-S_2$ from which the noise component has been removed may be eventually outputted.

In this first embodiment, random noise which is mixed with the signal when the sensor is reset may also be transferred to the memory unit during the operation (4). Then, since this random noise of the sensor unit is removed during the operation (9), a finally produced signal $-S_2$ may have a high S/N, which does not contain such a sensor random noise.

As previously described, in accordance with this first embodiment, since the ratio of W(width)/L(length) of the load MOS transistors is changed, the DC gain of the inverting amplifier employed in the pixel of the sensor unit is varied from the DC gain of the inverting amplifier employed in the memory of the memory unit. As a consequence, the AC gain adversely influenced by the stray capacitance can be made as an ideal value. In other words, since the above-explained operations are carried out, both the FPN of the signal output from the pixel of the sensor unit and the FPN of the signal output from the memory of the memory unit can be reduced.

Next, a description will now be made of a photoelectric converting apparatus according to a second embodiment of the present invention.

Also, in this second embodiment, in order to make the AC gain $G_{ACS}$ of the inverting amplifier coincident with the AC gain $G_{ACM}$, both the DC gain $G_{DCS}$ of the inverting amplifier and the DC gain $G_{DCM}$ may be made different from each other, which may satisfy the above-mentioned formula (3). To this end, the size (dimension) of the load MOS transistor of the pixel employed in the sensor unit is made equal to the size of the load MOS transistor of the memory employed in the memory unit, whereas the size of the amplifying MOS transistor of the pixel employed in the sensor unit is made different from the size of the amplifying MOS transistor of the memory employed in the memory unit. In other words, a size relationship between the MOS transistor 2 and the MOS transistor 18 may be set as follows:

$$W_2/L_2 < W_{18}/L_{18} \text{ (note: } W_6/L_6 = W_{22}/L_{22}\text{)},$$

assuming that a gate width of the MOS transistor 2 is $W_2$, a gate length of this MOS transistor 2 is $L_2$, a gate width of the MOS transistor 18 is $W_{18}$, and a gate length of the MOS transistor 18 is $L_{18}$.

If the gate width $W_2$ is made equal to the gate width $W_{18}$, then the gate lengths may be set as follows:

$$L_2 > L_{18}$$

Alternatively, if the gate length $L_2$ is made equal to the gate length $L_{18}$, then the gate widths may be set as follows:

$$W_2 < W_{18}$$

It should also be understood that the photoelectric converting apparatus according to this second embodiment may be operated in a similar manner to that of the first embodiment.

Subsequently, a photoelectric converting apparatus according to a third embodiment of the present invention will now be described.

Similar to the above-explained first and second embodiments, in order to make the AC gain $G_{ACS}$ of the inverting amplifier coincident with the AC gain $G_{ACM}$ of the inverting amplifier, this embodiment is characterized in that a gate oxide layer thickness of a MOS transistor that constitutes the inverting amplifier of the pixel of the sensor unit, and a gate oxide layer thickness of a MOS transistor that constitutes the inverting amplifier of the memory of the memory unit are varied, which may satisfy the above-mentioned formula (3).

In general, a mutual conductance $g_m$ of a MOS transistor is given as follows:

$$g_m \alpha (W/L) \cdot C_{OX} = W \cdot \epsilon_S \cdot \epsilon_O / LT_{OX}$$

As a consequence, to realize the above-described featured condition, the below-mentioned relationship may be established:

$$T_{Ox6} > T_{Ox22},$$

where symbol $T_{Ox6}$ implies the gate oxide layer thickness of the MOS transistor 6, and symbol $T_{Ox22}$ indicates the gate oxide layer thickness of the MOS transistor 22.

Alternatively, $$T_{Ox2} > T_{Ox18},$$

where symbol $T_{Ox2}$ implies the gate oxide layer thickness of the MOS transistor 2, and symbol $T_{Ox18}$ implies the gate oxide layer thickness of the MOS transistor 18.

It should also be noted that the photoelectric converting apparatus according to the third embodiment may be operated in a similar manner to that of the first embodiment.

While the present invention has been described as the first to third embodiments in which the circuit arrangements of the photoelectric converting apparatuses are manufactured by employing the MOS transistors, the present invention is not limited thereto. For example, the photoelectric converting apparatus equipped with the sensor unit, the transfer unit, and the memory unit may be manufactured by employing any types of transistors other than these MOS transistors, for instance, bipolar transistors. Although the inverting amplifier is constituted by the amplifying transistor and the load transistor, this inverting amplifier may be arranged by other circuit arrangements capable of obtaining inverted outputs.

As previously described, in accordance with the photoelectric converting apparatuses of the first to third embodiments, noise can be minimized.

Also, when this photoelectric converting apparatus is utilized in an AF (auto-focus) system of a camera, since noise may be reduced, for instance, a low brightness limit value and a low contrast limit value may be increased. As a result, there is such a merit that the performance of the AF system may be furthermore improved.

Many widely different embodiment of the present invention may be constructed without departing from the spirit and scope of the present invention. It should be understood that the present invention is not limited to the specific embodiments described in the specification, except as defined in the appended claims.

What is claimed is:

1. A photoelectric converting apparatus comprising:
    a sensor unit including a plurality of pixels each having at least a photoelectric converter and a first amplification transistor for amplifying a signal derived from said photoelectric converter to output the amplified signal; and
    a memory unit including a plurality of memories each having at least a storage element for storing therein the signal derived from said sensor unit and a second amplification transistor for amplifying a signal derived from said storage element to output an amplified signal
    wherein, each of said first and second amplification transistors has a DC gain and an AC gain, wherein said DC gain differs between said first and second amplification transistors, and wherein said sensor unit and said memory unit output respective signals with a same gain.

2. A photoelectric converting apparatus according to claim 1, wherein said first and said second amplification transistors are constituted by MOS transistors.

3. A photoelectric converting apparatus according to claim 2, wherein said first and said second amplification transistors are connected to respective load MOS transistors.

4. A photoelectric converting apparatus according to claim 3, wherein a conductance of the load MOS transistor connected to said first amplification transistor is different from a conductance of the load MOS transistor connected to said second amplification transistor.

5. A photoelectric converting apparatus according to claim 4, wherein respective gate lengths of said load MOS transistors differ.

6. A photoelectric converting apparatus according to claim 4, wherein respective gate widths of said load MOS transistors differ.

7. A photoelectric converting apparatus according to claim 4, respective gate oxide layer thicknesses of said load MOS transistors differ.

8. A photoelectric converting apparatus according to claim 3, wherein respective conductances of said first and second amplification transistors differ.

9. A photoelectric converting apparatus according to claim 8, wherein respective gate lengths of said first and second amplification transistors differ.

10. A photoelectric converting apparatus according to claim 8, wherein respective gate widths of said first and second amplification transistors differ.

11. A photoelectric converting apparatus according to claim 8, wherein respective gate oxide layer thicknesses of said first and second amplification transistors differ.

12. A photoelectric converting apparatus according to claim 1, further comprising a transferring system for amplifying the signal derived from said sensor unit and/or said memory unit to transfer the amplified signal to said sensor unit and/or said memory unit.

* * * * *

UNITED STATES PATENT AND TRADEMARK OFFICE
CERTIFICATE OF CORRECTION

PATENT NO. : 6,989,863 B1
APPLICATION NO. : 09/384973
DATED : January 24, 2006
INVENTOR(S) : Hidekazu Takahashi It is certified that error appears in the above-identified patent and that said Letters Patent is hereby corrected as shown below:

ON TITLE PAGE AT (54) TITLE

"AD" should read --AND--.

COLUMN 1

Line 3, "AD" should read --AND--.

COLUMN 4

Line 27, "$C_{SM})\}\cdot G_{DCM}$" should read --$C_{SM}\}\cdot G_{DCM}$--.

COLUMN 5

Line 25, "$-2_T$" should read --$2N_T$--; and
Line 26, "$(-2N_T+n_M)$." should read --$(-2N_T+N_M)$.--.

COLUMN 6

Line 63, "$\phi_{CR}$," should read --$\phi_{GR}$,--.

Signed and Sealed this

Eighth Day of August, 2006

JON W. DUDAS
*Director of the United States Patent and Trademark Office*